(12) United States Patent
Gurr et al.

(10) Patent No.: US 11,128,123 B2
(45) Date of Patent: Sep. 21, 2021

(54) METHOD FOR OPERATING AN ELECTRIC GARDENING AND/OR FORESTRY APPARATUS SYSTEM, PROTECTIVE ELECTRONIC CIRCUIT, PROTECTIVE ELECTRONIC CIRCUIT SYSTEM, ACCUMULATOR SYSTEM AND ELECTRIC GARDENING AND/OR FORESTRY APPARATUS SYSTEM

(71) Applicant: Andreas Stihl AG & Co. KG, Waiblingen (DE)

(72) Inventors: Kay-Steffen Gurr, Heilbronn (DE); Martin Schurr, Mutlangen (DE); Andreas Mack, Schwaikheim (DE); Christian Heigemeyr, Egweil (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 93 days.

(21) Appl. No.: 15/952,562

(22) Filed: Apr. 13, 2018

(65) Prior Publication Data
US 2018/0301892 A1 Oct. 18, 2018

(30) Foreign Application Priority Data
Apr. 13, 2017 (EP) .................... 17166630

(51) Int. Cl.
*H02H 3/00* (2006.01)
*H02H 7/08* (2006.01)
(Continued)

(52) U.S. Cl.
CPC ............. *H02H 7/08* (2013.01); *G01R 19/165* (2013.01); *G01R 31/3277* (2013.01);
(Continued)

(58) Field of Classification Search
CPC .. A01G 3/053; G01R 19/165; G01R 31/3277; G01R 31/343; H02H 1/0007; H02H 3/006; H02H 3/087; H02H 3/385; H02H 7/08
(Continued)

(56) References Cited

U.S. PATENT DOCUMENTS 5,489,835 A 2/1996 Stephens et al.
5,945,809 A 8/1999 Inaba et al.
(Continued)

FOREIGN PATENT DOCUMENTS

CN 101132161 A 2/2008
CN 103178498 A 6/2013
(Continued)

OTHER PUBLICATIONS

German-language European Office Action issued in counterpart European Application No. 17 166 630.8 dated Feb. 8, 2019 (five (5) pages).
(Continued)

*Primary Examiner* — Kawing Chan
*Assistant Examiner* — Gabriel Agared
(74) *Attorney, Agent, or Firm* — Crowell & Moring LLP (57) ABSTRACT

A method for operating an electric gardening and/or forestry apparatus system having an accumulator, a gardening and/or forestry apparatus with an electric motor, and a protective electronic circuit including inputs which are connected to the accumulator, outputs which are connected to the gardening and/or forestry apparatus, and a switching element which is disposed in a power path between one of the inputs and one of the outputs. The method turns on the switching element to a first conductive condition, measures an electric current through the power path, turns off the switching element to a second conductive condition, if the measured
(Continued)

electric current exceeds a predetermined current limit value, measures an electric output voltage between the outputs, and either again turns on the switching element to the first conductive condition, if the measured electric output voltage reaches and/or exceeds a predetermined voltage limit value, or outputs an error signal, if the measured electric output voltage is below the predetermined voltage limit value.

19 Claims, 2 Drawing Sheets (51) Int. Cl.
    *H02H 3/087* (2006.01)
    *H02H 3/38* (2006.01)
    *G01R 31/327* (2006.01)
    *G01R 31/34* (2020.01)
    *G01R 19/165* (2006.01)
    *H02H 1/00* (2006.01)
    *A01G 3/053* (2006.01)

(52) U.S. Cl.
    CPC ......... *G01R 31/343* (2013.01); *H02H 1/0007* (2013.01); *H02H 3/006* (2013.01); *H02H 3/087* (2013.01); *H02H 3/385* (2013.01); *A01G 3/053* (2013.01)

(58) Field of Classification Search
    USPC .......................................................... 360/30
    See application file for complete search history.

(56) References Cited

U.S. PATENT DOCUMENTS

| | | | |
|---|---|---|---|
| 6,005,377 A * | 12/1999 | Chen | H02M 3/157 323/223 |
| 8,553,373 B2 | 10/2013 | Rozman et al. | |
| 8,779,735 B2 | 7/2014 | Roessler et al. | |
| 8,842,404 B2 | 9/2014 | Vogel | |
| 9,049,770 B2 | 6/2015 | Schmitt | |
| 9,425,608 B2 | 8/2016 | Kleczewski et al. | |
| 9,614,382 B2 | 4/2017 | Peterswerth et al. | |
| 2005/0140327 A1 | 6/2005 | Carolan | |
| 2007/0229011 A1 * | 10/2007 | Knab | H02H 7/0811 318/434 |
| 2008/0076012 A1 * | 3/2008 | Lienkamp | H01M 8/04992 429/65 |
| 2008/0150460 A1 | 6/2008 | Rosskamp | |
| 2008/0180134 A1 * | 7/2008 | Jenkins | G01R 31/2621 327/77 |
| 2009/0253377 A1 * | 10/2009 | Trachewsky | H04B 17/382 455/67.11 |
| 2009/0284877 A1 * | 11/2009 | Heravi | H02H 7/09 361/31 |
| 2014/0084827 A1 * | 3/2014 | Schwarz | H03K 17/0828 318/400.21 |
| 2016/0054421 A1 * | 2/2016 | Horstmann | G01R 31/50 324/537 |
| 2016/0072269 A1 | 3/2016 | Esschendal et al. | |

FOREIGN PATENT DOCUMENTS

| | | |
|---|---|---|
| CN | 103548266 A | 1/2014 |
| CN | 104039034 A | 9/2014 |
| DE | 197 43 234 A1 | 4/1999 |
| DE | 10 2012 203 995 A1 | 9/2012 |
| DE | 10 2012 103 551 A1 | 10/2013 |
| DE | 10 2013 214 726 A1 | 1/2015 |
| DE | 10 2014 214 984 A1 | 2/2016 |
| EP | 2 562 893 A2 | 2/2013 |
| GB | 2 275 139 A | 8/1994 |
| WO | WO 2010/089338 A2 | 8/2010 |

OTHER PUBLICATIONS

Chinese-language Office Action issued in Chinese Application No. 201810330969.3 dated Jan. 4, 2021 with English translation (19 pages).

* cited by examiner

METHOD FOR OPERATING AN ELECTRIC GARDENING AND/OR FORESTRY APPARATUS SYSTEM, PROTECTIVE ELECTRONIC CIRCUIT, PROTECTIVE ELECTRONIC CIRCUIT SYSTEM, ACCUMULATOR SYSTEM AND ELECTRIC GARDENING AND/OR FORESTRY APPARATUS SYSTEM

CROSS REFERENCE TO RELATED APPLICATION

This application claims priority under 35 U.S.C. § 119 from European Patent Application No. 17166630.8, filed Apr. 13, 2017, the entire disclosure of which is herein expressly incorporated by reference.

BACKGROUND AND SUMMARY OF THE INVENTION

The invention relates to a method for operating an electric gardening and/or forestry apparatus system, a protective electronic circuit for an electric gardening and/or forestry apparatus system, a protective electronic circuit system comprising such a protective electronic circuit, an accumulator system comprising such a protective electronic circuit, and an electric gardening and/or forestry apparatus system comprising such a protective electronic circuit.

A method for operating an electric gardening and/or forestry apparatus system, a protective electronic circuit for an electric gardening and/or forestry apparatus system and an electric gardening and/or forestry apparatus system comprising such a protective electronic circuit are known.

The invention addresses the problem of providing a method for operating an electric gardening and/or forestry apparatus system which has improved properties, in particular more functionalities. Furthermore, the invention addresses the problem of providing a protective electronic circuit for an electric gardening and/or forestry apparatus system, a protective electronic circuit system comprising such a protective electronic circuit, an accumulator system comprising such a protective electronic circuit, and an electric gardening and/or forestry apparatus system comprising such a protective electronic circuit.

The invention solves this problem by providing a method for operating an electric gardening and/or forestry apparatus system, a protective electronic circuit for an electric gardening and/or forestry apparatus system, a protective electronic circuit system, an accumulator system, and an electric gardening and/or forestry apparatus system, in accordance with embodiments of the invention.

The method according to the invention is configured for operating an electric gardening and/or forestry apparatus system. The electric gardening and/or forestry apparatus system comprises an accumulator, a gardening and/or forestry apparatus having an electric motor, and a protective electronic circuit. The protective electronic circuit includes inputs, outputs and a switching element. The inputs, in particular input terminals, are connected, in particular electrically, to the accumulator. The outputs, in particular output terminals, are connected, in particular electrically, to the gardening and/or forestry apparatus. The switching element is disposed, in particular electrically, in a power path between one of the inputs and one of the outputs. The method comprises the steps: a) turning on the switching element to a first conductive condition; b) measuring an electric current through the power path; c) turning off the switching element to a second conductive condition, which in particular is different from the first conductive condition and which may be designated as an off condition, if the measured electric current exceeds a predetermined current limit value; d) measuring an electric output voltage between the outputs, and either e1) again turning on the switching element to the first conductive condition, if the measured electric output voltage reaches and/or exceeds a predetermined voltage limit value, or e2) respectively, as an alternative to step e1), outputting an error signal, in particular a short-circuit signal, if the measured electric output voltage is below the predetermined voltage limit value.

The most recent developments and technologies are leading to accumulators having ever lower inductances and lower resistances, particularly in the case of lithium-ion accumulators. One consequence thereof is very short current rise times, in particular less than 50 microseconds (µs) for 350 amperes (A), and a very high electric current in the case of a short circuit, in particular up to 900 A.

In particular, the gardening and/or forestry apparatus can comprise a motor electronic circuit for the electric motor, which circuit can comprise at least one electric energy store or a link circuit capacitor and/or at least one motor switching element, wherein the electric energy store or the link circuit capacitor and/or the motor switching element can be connected, in particular electrically, to the outputs of the protective electronic circuit and to the electric motor. In particular, the link circuit capacitor can comprise an electrolytic capacitor. In particular, the motor switching element can comprise a bridge transistor.

The method makes it possible to protect the gardening and/or forestry apparatus against an overcurrent, in particular the motor electronic circuit thereof, if present, and/or to cap the current through the power path to an amount which can still be reliably switched by the motor switching element, if present. In particular, the method can make it possible to comply with the safe operating area (SOA) for the motor switching element. In particular, the method can make it possible to limit a current magnitude during the charging of the electric energy store or the link circuit capacitor, if present.

In addition, the method makes it possible to differentiate an overcurrent on account of an electrical short circuit from an overcurrent which may be caused in particular by a relatively low internal inductance and/or a relatively low internal resistance of the accumulator. If the current limit value is exceeded, the switching element is turned off. A differentiation between a short-circuit case and normal operation, in particular charging of the electric energy store or the link circuit capacitor, if present, may not be possible solely by means of the criterion "current magnitude", particularly not when an accumulator of more recent design is used. A differentiation between a short-circuit case and normal operation can be carried out by means of the further criterion "output voltage magnitude". If the output voltage falls below the voltage limit value after the fact of the current limit value being exceeded has been identified, then a short circuit is present, otherwise this is normal operation. This is because typically in normal operation, after the switching element has been turned off, the electric energy store or the link circuit capacitor will already be at least partly, in particular completely, charged, in particular to the voltage limit value, and the output voltage will thus not fall below the voltage limit value. In the case of a short circuit, typically, after the switching element has been turned off, the electric energy store or the link circuit capacitor will be discharged or even not charged and the output voltage will thus be below the voltage limit value.

In particular, the accumulator can be configured as an exchangeable accumulator. Consequently, it cannot be ruled out that an accumulator of older design can be used in the electric gardening and/or forestry apparatus system. The method can be compatible with an accumulator both of older design and of more recent design. In particular, an electric current greater than the current limit value can be prevented in all operating cases, independently of whether the feeding is effected by means of an older or more recent accumulator.

In particular, an ohmic resistance of the power path can be determined and/or dominated by an ohmic resistance of the switching element, if the latter is turned on to its first conductive condition. This can make it possible that the electric energy store or the link circuit capacitor, if present, can be charged as rapidly as possible.

In particular, step b) can be performed at the same time as and/or temporally after step a); in particular, step b) can be performed permanently in respect of time. In particular, step c) can be performed at the same time as and/or temporally after step b). In particular, step d) can be performed at the same time as and/or temporally after step b) and/or c); in particular, step d) can be performed permanently in respect of time. In particular, step e1) can be performed at the same time as and/or temporally after step c) and/or d). In particular, step e2) can be performed at the same time as and/or temporally after step c) and/or d).

The error signal can be output in particular acoustically, optically and/or haptically. In addition, in step e2) the switching element can be retained, held and/or left in the second conductive condition.

In particular, the method can be performed automatically. In other words, the method can be performed without human intervention.

In one development of the invention, the predetermined current limit value is in a range from 200 A to 500 A. In particular, the current limit value can be in a range from 300 A to 400 A; in particular, the current limit value can be 350 A. Consequently, the current limit value can be above a current value in continuous operation and/or toggle operation, for example from 50 A to 100 A. Additionally or alternatively, the accumulator provides an input voltage with an input voltage value between the inputs and the predetermined voltage limit value is a function of the input voltage value. In particular, the voltage limit value can be half the input voltage value. If the output voltage falls below half the input voltage or below what was previously half the output voltage after the fact of the current limit value being exceeded has been identified, then a short circuit is present, otherwise this is normal operation.

In one development of the invention, step e1) is performed in a range from 0.5 milliseconds (ms)=500 µs to 10 ms subsequent to step c). This time range may be imperceptible to a user and/or tolerable for electric components of the electric gardening and/or forestry apparatus system. In particular, step e1) can be performed in a range from 0.5 ms to 5 ms, in particular in a range from 0.5 ms to 2 ms, in particular 1 ms, subsequent to step c).

In one development, steps b) to e1) are repeated. This can ensure that, in the event of the electric current once again exceeding the predetermined current limit value, the switching element can be turned off to its second conductive condition. In particular, steps b) to e1) can be repeated multiply, in particular performed at least ten times. If the electric current still exceeds the predetermined current limit value, the switching element can be turned off to its second conductive condition, can be maintained in the second conductive condition, and the error signal can be output.

In one development of the invention, the switching element includes a field effect transistor (FET), in particular a metal oxide semiconductor field effect transistor (MOSFET). There is applied to the field effect transistor a control voltage for turning on to the first conductive condition thereof and for turning off to the second conductive condition thereof on a control electrode. Step c) comprises: generating the control voltage such that an avalanche effect does not occur. This can reduce or prevent damage to the switching element during turn-off. In particular, step c) can comprise: switching the switching element, in particular firstly, into linear operation, which may be designated as a third conductive condition between the first conductive condition and the second conductive condition and, in particular subsequently, turning off the switching element to its second conductive condition. In particular, the control voltage can be generated as a function of a switching voltage of the field effect transistor. The switching voltage can be a voltage dropped across a drain-source path at the field effect transistor.

In one development of the invention, the method comprises the steps: measuring a first electric voltage drop on the switching element, when the switching element is turned on to the first conductive condition thereof measuring a second electric voltage drop on the switching element, when the switching element is turned off to the second conductive condition thereof and determining a proper operation of the switching element as a function of a difference between the second electric voltage drop and the first electric voltage drop. The difference measurement can make it possible to eliminate absolute measurement errors in the measurement accuracy. If the switching element does not operate properly, in particular an error signal can be output. The first voltage drop and the second voltage drop can be measured in particular by means of measuring the input voltage, measuring the output voltage and forming a difference between the input voltage and the output voltage.

In one development of the invention, the method comprises the steps: providing an, in particular predetermined, electric minimum power by the accumulator on the outputs, even if the switching element is turned off to the second conductive condition; and performing a self-check of the gardening and/or forestry apparatus using the provided electric minimum power. This can make it possible to determine a proper operation of the motor electronic circuit, if present. In particular, the electric motor need not be operated in this case.

Furthermore, the invention relates to a protective electronic circuit for an electric gardening and/or forestry apparatus system, in particular for performing the method described above. The protective electronic circuit according to the invention comprises inputs, outputs, a switching element, a current measuring device, a voltage measuring device, an output device and a control unit. The inputs are configured to be connected to an accumulator. The outputs are configured to be connected to a gardening and/or forestry apparatus having an electric motor. The switching element is disposed in a power path between one of the inputs and one of the outputs. The current measuring device is configured to measure an electric current through the power path. The voltage measuring device is configured to measure an electric output voltage between the outputs. The output device is configured to output an error signal. The control unit is configured to interact with the switching element, the current measuring device, the voltage measuring device and the output device. Furthermore, the control unit is configured to turn on the switching element to a first conductive condition, to turn off the switching element to a second conductive condition, if the measured electric current exceeds a predetermined current limit value, to again turn on the switching element to the first conductive condition, if the measured electric output voltage reaches and/or exceeds a predetermined voltage limit value, and to activate the output device to output the error signal, if the measured electric output voltage is below the predetermined voltage limit value.

The protective electronic circuit makes it possible to protect the gardening and/or forestry apparatus against an overcurrent, in particular the motor electronic circuit thereof, if present, and/or to cap the current through the power path to an amount which can still be reliably switched by the motor switching element, if present. In addition, the protective electronic circuit makes it possible to differentiate an overcurrent on account of a short circuit from an overcurrent which can be caused in particular by a relatively low internal inductance and/or a relatively low internal resistance of the accumulator.

The protective electronic circuit can be compatible with an accumulator both of older design and of more recent design. In particular, an electric current greater than the current limit value can be prevented in all operating cases, independently of whether the feeding is effected by means of an older or more recent accumulator.

In particular, the protective electronic circuit can be configured to perform the method described above. In particular, the output device can comprise a buzzer, a loudspeaker, a display, in particular an LED, and/or a vibration device.

In one development of the invention, the switching element includes an electronic switching element, in particular a field effect transistor, a bipolar transistor and/or an insulated gate bipolar transistor (IGBT). The electronic switching element can enable a relatively rapid turn-on and/or a relatively rapid turn-off.

In one configuration of the invention, the switching element includes a field effect transistor. The field effect transistor is configured such that a control voltage for turning on to the first conductive condition thereof and for turning off to the second conductive condition thereof is applied on a control electrode. The protective electronic circuit includes a voltage limiting element. The voltage limiting element is configured to generate the control voltage such that an avalanche effect does not occur. In particular, the voltage limiting element can comprise a Z diode or a Zener diode.

In one development, the protective electronic circuit comprises a bypass path. The bypass path is coupled in the power path in parallel to the switching element and includes a current limiting resistor element. This can make it possible to limit the current, particularly if the switching element is turned off to its second conductive condition. In particular, the ohmic resistance of the power path can be determined and/or dominated by the ohmic resistance of the switching element, if the latter is turned on to the first conductive condition thereof. In particular, the ohmic resistance of the power path can be determined and/or dominated by an ohmic resistance of the current limiting resistor element, if the switching element is turned off to the second conductive condition thereof. In particular, the ohmic resistance of the switching element, if the latter is turned on to the first conductive condition thereof, can be relatively lower than the ohmic resistance of the current limiting resistor element. In particular, the ohmic resistance of the switching element, if the latter is turned off to the second conductive condition thereof, can be relatively greater than the ohmic resistance of the current limiting resistor element. Furthermore, this can make it possible to measure the first electric voltage drop on the switching element, to measure the second electric voltage drop and to determine the proper operation of the switching element. Moreover, this can make it possible to provide the electric minimum power on the outputs, even if the switching element is turned off to the second conductive condition, and to perform the self-check of the gardening and/or forestry apparatus.

In addition, the invention relates to a protective electronic circuit system. The protective electronic circuit system according to the invention comprises a protective electronic circuit as described above, and a user carrying device. The protective electronic circuit is arranged in the user carrying device. The user carrying device is configured to allow carrying of the protective electronic circuit by a user. In particular, the user carrying device can comprise and/or be a belt pouch and/or a rucksack. In particular, the user carrying device can comprise an accumulator receiving device, wherein the accumulator receiving device can be configured to receive, in particular exchangeably, an, in particular exchangeable, accumulator.

Furthermore, the invention relates to an accumulator system. The accumulator system according to the invention comprises an accumulator, and a protective electronic circuit as described above. The inputs are connected to the accumulator. In particular, the accumulator with the protective electronic circuit can be configured as one component. In particular, the accumulator system can comprise the user carrying device.

In addition, the invention relates to an electric gardening and/or forestry apparatus system. The electric gardening and/or forestry apparatus system according to the invention comprises a gardening and/or forestry apparatus having an electric motor, and a protective electronic circuit as described above. The outputs are connected to the gardening and/or forestry apparatus. In particular, the gardening and/or forestry apparatus with the protective electronic circuit can be configured as one component. In particular, the electric gardening and/or forestry apparatus system can comprise the user carrying device. In particular, the electric gardening and/or forestry apparatus system can comprise the accumulator.

In one development of the invention, the gardening and/or forestry apparatus is a saw, a pole pruner, a clearing or chain saw, a brush cutter, a hedge pruner, hedge shears, a hedge cutter, a hedge trimmer, a blower device, a leaf blower, a lopper, a cutoff grinder, a sweeper device, a sweeper roller, a sweeper brush, a lawn mower, a dethatcher, grass shears and/or a grass trimmer.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 2:
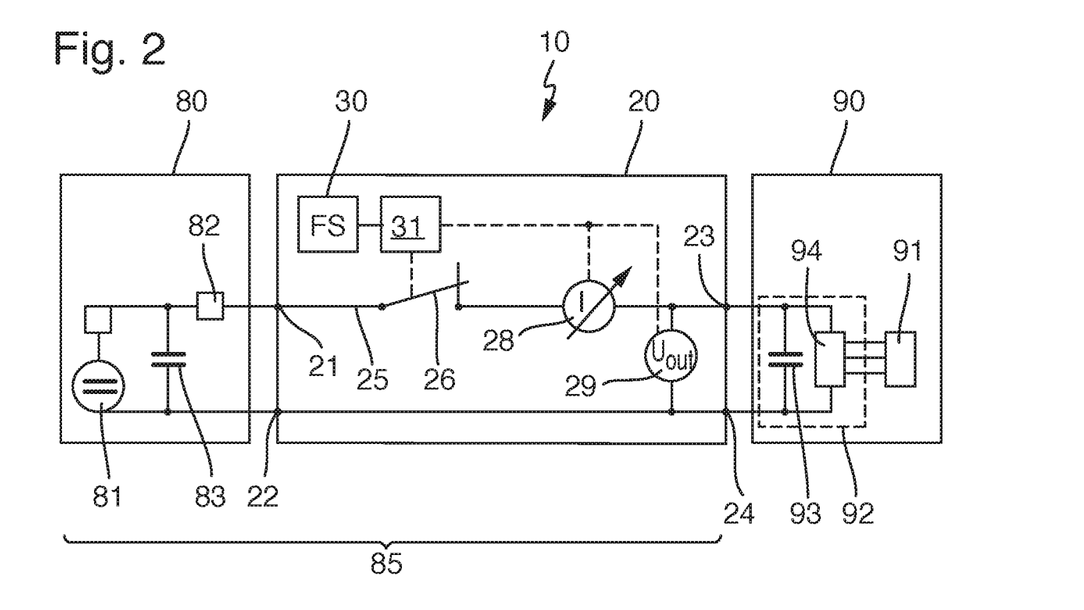
FIG. 2 shows an equivalent circuit diagram of an electric gardening and/or forestry apparatus system according to an embodiment of the invention.
Figure 3:
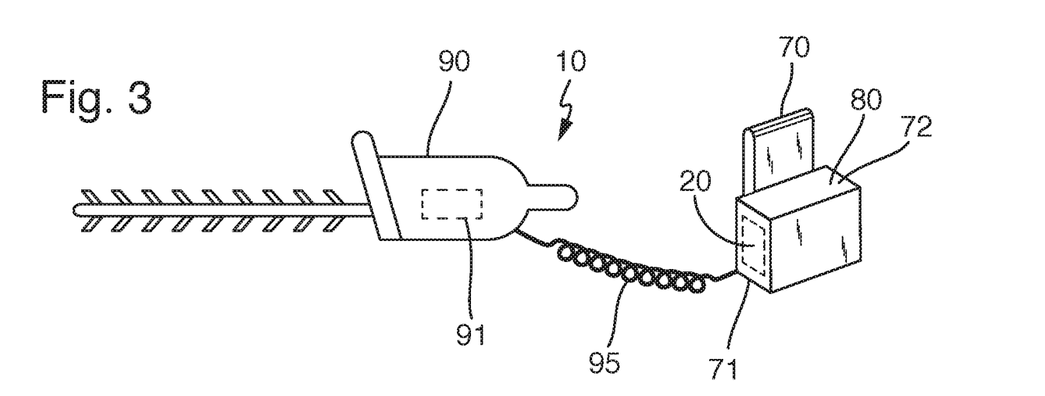
FIG. 3 shows a schematic view of the electric gardening and/or forestry apparatus system from FIG. 2.

FIGS. 2 and 3 show an electric gardening and/or forestry apparatus system 10 according to an embodiment of the invention. The electric gardening and/or forestry apparatus system comprises an accumulator 80, a gardening and/or forestry apparatus 90 in the form of a hedge trimmer having an electric motor 91 and a protective electronic circuit 20. The protective electronic circuit 20 comprises inputs 21, 22, in particular two, outputs 23, 24, in particular two, and a switching element 26. The inputs 21, 22 are connected to the accumulator 80. The outputs 23, 24 are connected to the gardening and/or forestry apparatus 90. The switching element 26 is disposed in a power path 25 between the input 21 and the output 23. In particular, the power path 25 extends further, in particular between the input 22 and the output 24. In particular, an electric current I flows through the power path 25 from the accumulator 80 towards the gardening and/or forestry apparatus 90 and back from the latter through the power path 25 to the accumulator 80.

Figure 5A:
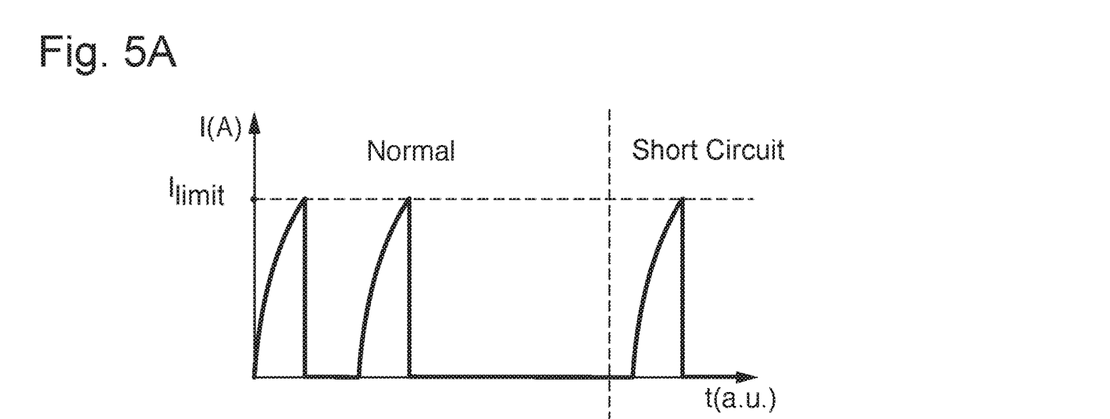
FIG. 5A shows a graph of an electric current through a power path of the protective electronic circuit from FIG. 4 against time.
Figure 5B:
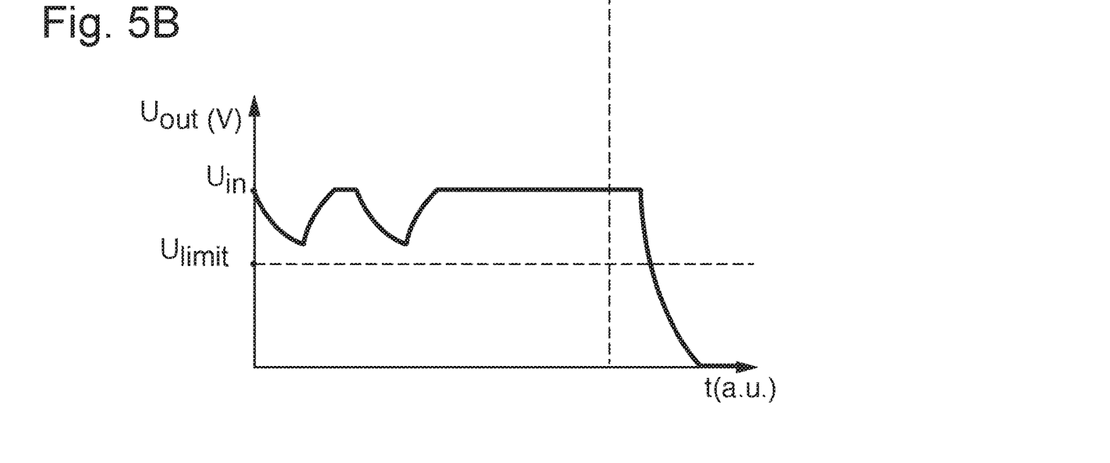
FIG. 5B shows a graph of an electric output voltage between outputs of the protective electronic circuit from FIG. 4 against time.

Furthermore, the protective electronic circuit 20 comprises a current measuring device 28, a voltage measuring device 29, an output device 30 and a control unit 31. The current measuring device 28 is configured to measure the electric current I through the power path 25. The voltage measuring device 29 is configured to measure an electric output voltage Uout between the outputs 23, 24. The output device 30 in the form of a buzzer is configured to output an error signal FS. The control unit 31 in the form of a microcontroller is configured to interact with the switching element 26, the current measuring device 28, the voltage measuring device 29 and the output device 30, as indicated by dashed lines in FIG. 2. Furthermore, the control unit 31 is configured to turn on the switching element 26 to a first conductive condition "on", to turn off the switching element 26 to a second conductive condition "off", if the measured electric current I exceeds a predetermined current limit value Ilimit, as can be discerned in FIG. 5A, to again turn on the switching element 26 to the first conductive condition "on", if the measured electric output voltage Uout reaches and/or exceeds a predetermined voltage limit value Ulimit, as can be discerned on the left in FIG. 5B, and to activate the output device 30 to output the error signal FS, if the measured electric output voltage Uout is below the predetermined voltage limit value Ulimit, as can be discerned on the right in FIG. 5B.

In the exemplary embodiment shown, the current measuring device 28 is disposed between the upper input 21 in FIG. 2 and the upper output 23. In alternative exemplary embodiments, the current measuring device 28 can be disposed between the lower input 22 in FIG. 2 and the lower output 24. A section of the power path 25 between the input 22 and the output 24 may be designated as an earth path.

Figure 1:
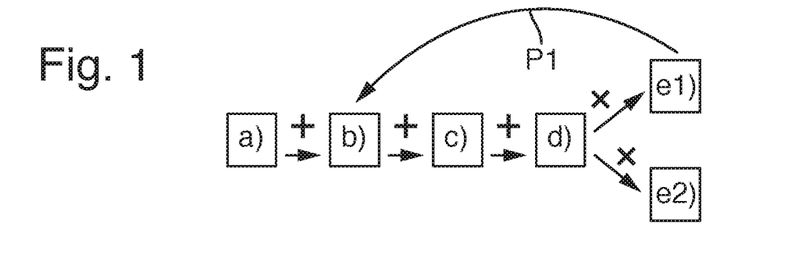
FIG. 1 shows a flow diagram of a method according to an embodiment of the invention.

FIG. 1 shows a method according to an embodiment of the invention for operating the electric gardening and/or forestry apparatus system 10, in particular by means of the above-described protective electronic circuit 20 and/or by means of the above-described electric gardening and/or forestry apparatus system 10. The method comprises the steps: a) turning on the switching element 26 to the first conductive condition on; b) measuring the electric current I through the power path 25; c) turning off the switching element 26 to the second conductive condition off, if the measured electric current I exceeds the predetermined current limit value Ilimit; d) measuring the electric output voltage Uout between the outputs 23, 24; and either e1) either again turning on the switching element 26 to the first conductive condition on, if the measured electric output voltage Uout reaches and/or exceeds the predetermined voltage limit value Ulimit; or e2) outputting the error signal signal FS, in particular acoustically, if the measured electric output voltage Uout is below the predetermined voltage limit value Ulimit. In addition, in step e2) the switching element 26 can be retained and/or left in the second conductive condition off.

In detail, the accumulator 80 may be described by an ideal voltage source 81, an electric component 82, in particular in the form of an inductance, and a further electric component 83, in particular in the form of a capacitor. The further component 83 can be connected in parallel with the voltage source 81 and/or the component 82 can be connected in series with the voltage source 81, as can be discerned in FIG. 2. While in the case of an accumulator of older design the component 82 generally has an appreciable influence on the characteristic of the accumulator, in the case of an accumulator of relatively recent design the component 82 generally has hardly any influence on the characteristic of the accumulator, but rather the component 83. One consequence thereof is, in the case of an accumulator of relatively recent design, very short current rise times and a very high electric current in the case of a short circuit.

In the exemplary embodiment shown, the gardening and/or forestry apparatus 90 comprises a motor electronic circuit 92 for the electric motor 91. The motor electronic circuit 92 comprises an electric energy store or a link circuit capacitor 93 in the form of an electrolytic capacitor and a motor switching element 94 in the form of a plurality of bridge transistors. The electric energy store or the link circuit capacitor 93 and the motor switching element 94 are respectively connected to the outputs 23, 24 of the protective electronic circuit 20 and to the electric motor 91.

If the switching element 26 is turned on to its first conductive condition on, which is indicated in FIG. 2 by the switching element 26 in a closed condition, the accumulator 80 can charge the electric energy store or the link circuit capacitor 93 by means of the electric current I. If the accumulator 80 is of relatively recent design, the electric current I can exceed the predetermined current limit value Ilimit, as can be discerned on the left in FIG. 5A, in particular caused by the relatively low internal inductance 82 of the accumulator 80 and not by an electric short circuit. Consequently, the switching element 26 is turned off to its second conductive condition off, which here is not illustrated by the switching element in an open condition. Since normal operation rather than a short circuit is present, the output voltage Uout will not fall below the voltage limit value Ulimit, as can be discerned on the left in FIG. 5B. This is because typically during normal operation, after the switching element 26 has been turned off, the electric energy store or the link circuit capacitor 93 will already be at least partly charged, in particular to the voltage limit value Ulimit, and the output voltage Uout will thus not fall below the voltage limit value Ulimit.

If an electric cable 95—shown in FIG. 3—of the electric gardening and/or forestry apparatus system 10, which electrically connects the protective electronic circuit 20 to the gardening and/or forestry apparatus 90 in the form of the hedge trimmer, is unfavorably acted on by a user with the hedge trimmer, this can lead to an electric short circuit in the cable 95, in particular to an electric short-circuit connection between the outputs 23, 24. If the switching element 26 is or has been turned on to its first conductive condition on, the electric current I will exceed the predetermined current limit value Ilimit, as can be discerned on the right in FIG. 5A, in particular caused by the short circuit. Consequently, the switching element 26 is turned off to its second conductive condition off. Since a short circuit rather than normal operation is present, the output voltage Uout will fall below the voltage limit value Ulimit, in particular to 0 volts (V), as can be discerned on the right in FIG. 5B. This is because typically in the case of a short circuit, after the switching element 26 has been turned off, the electric energy store or the link circuit capacitor 93 will be discharged or even not charged and the output voltage Uout will thus be below the voltage limit value Ulimit. Measuring the electric output voltage Uout makes it possible to differentiate normal operation from the short-circuit case.

Consequently, the method and the protective electronic circuit 20 each make it possible to protect the gardening and/or forestry apparatus 90, in particular the motor electronic circuit 92 thereof, against an overcurrent, to limit the current I through the power path 25 to an amount which can still be reliably switched by the motor switching element 94, and to limit a current magnitude during the charging of the electric energy store or the link circuit capacitor 93. In addition, the method and the protective electronic circuit 20 each make it possible to differentiate an overcurrent on account of a short circuit from an overcurrent which may be caused or have been caused in particular by the relatively low internal inductance 82 of the accumulator 80.

Furthermore, the method and the protective electronic circuit 20 are in each case compatible with an accumulator both of older design and of more recent design, particularly if the accumulator is configured as an exchangeable accumulator. In particular, an electric current greater than the current limit value can be prevented in all operating cases, independently of whether the feeding is effected by means of an older or more recent accumulator.

In the exemplary embodiment shown, the predetermined current limit value Ilimit is 350 A. In addition, the accumulator 80 provides an input voltage Uin with an input voltage value between the inputs 21, 22, as can be discerned on the left in FIG. 4, and the predetermined voltage limit value Ulimit is a function of the input voltage value. In particular, the voltage limit value Ulimit is half the input voltage value. In the exemplary embodiment shown, the input voltage value is 36 V and the voltage limit value Ulimit is 18 V.

In addition, step e1) is performed 1 ms subsequent to step c).

Furthermore, steps b) to e1) are repeated, as indicated by the arrow P1 in FIG. 1. In particular, steps b) to e1) are performed ten times. If the electric current I furthermore exceeds the predetermined current limit value Ilimit, the switching element 26 can be turned off to the second conductive condition "off" thereof, can be maintained in the second conductive condition off, and the error signal FS can be output.

Figure 4:
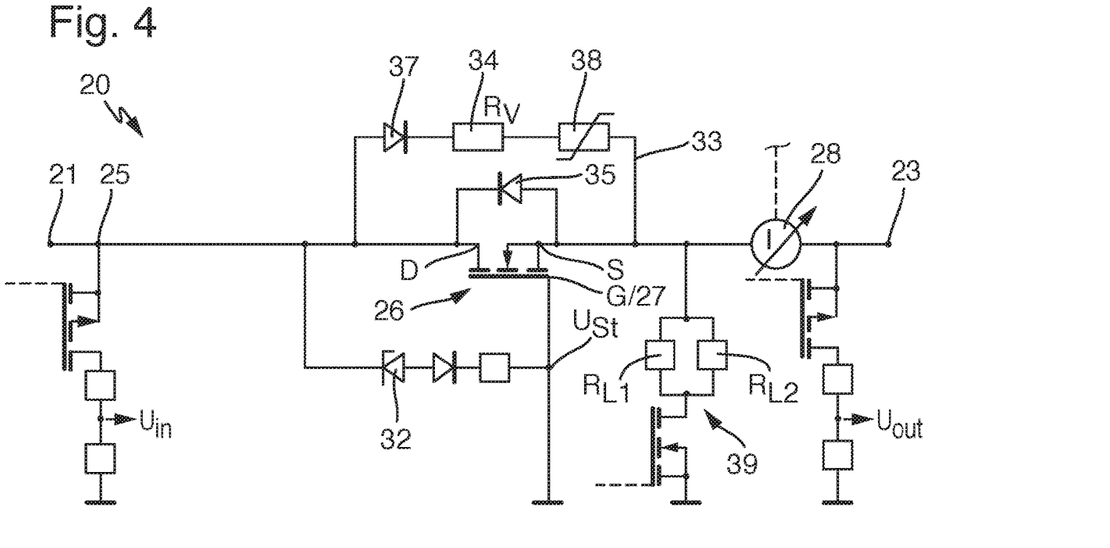
FIG. 4 shows a detailed equivalent circuit diagram of an excerpt from a protective electronic circuit according to an embodiment of the invention of the electric gardening and/or forestry apparatus system from FIG. 2.

In addition, the switching element 26 comprises an electronic switching element in the form of a field effect transistor, as can be discerned in FIG. 4. The field effect transistor is configured to have applied to it a control voltage Ust for turning on to the first conductive condition "on" thereof and for turning off to the second conductive condition "off" thereof on a control electrode 27. The protective electronic circuit 20 comprises a voltage limiting element 32 in the form of a Zener diode. The voltage limiting element 32 is configured to generate the control voltage Ust such that an avalanche effect does not occur. Accordingly, step c) comprises: generating the control voltage Ust such that an avalanche effect does not occur. In detail, the voltage limiting element 32 is configured to generate the control voltage Ust such that the switching element 26 is switched to linear operation and is turned off to the second conductive condition "off" thereof. Accordingly, step c) comprises: switching the switching element 26 to linear operation and turning off the switching element 26 to the second conductive condition "off" thereof. In the exemplary embodiment shown, the control voltage Ust is generated as a function of a switching voltage of the field effect transistor, said switching voltage being dropped across a drain (D)-source (S) path at said transistor.

Furthermore, in the power path 25, a freewheeling diode 35 in a reverse direction is connected in parallel with the switching element 26.

In addition, the protective electronic circuit 20 comprises a bypass path 33. The bypass path 33 is coupled in the power path 25 in parallel to the switching element 26 and includes a current limiting resistor element 34. In the exemplary embodiment shown, an ohmic resistance of the power path 25 is dominated by an ohmic resistance of the switching element 26, if the latter is turned on to the first conductive condition "on" thereof. The ohmic resistance of the power path 25 is dominated by an ohmic resistance of the current limiting resistor element 34, if the switching element 26 is turned off to the second conductive condition "off" thereof. In other words, the ohmic resistance of the switching element 26, if the latter is turned on to the first conductive condition "on" thereof, is relatively lower than the ohmic resistance of the current limiting resistor element 34. The ohmic resistance of the switching element 26, if the latter is turned off to the second conductive condition "off" thereof, is relatively greater than the ohmic resistance of the current limiting resistor element 34. Furthermore, in the bypass path 33, a kickback protective element 37 in the form of a diode is connected in series with the current limiting resistor element 34. In addition, in the bypass path 33, a poly-switch 38 is connected in series with the current limiting resistor element 34.

Furthermore, the method comprises the steps: measuring a first electric voltage drop on the switching element 26, when the switching element 26 is turned on to the first conductive condition "on" thereof; measuring a second electric voltage drop on the switching element 26, when the switching element 26 is turned off to the second conductive condition "off" thereof; determining a proper operation of the switching element 26 as a function of a difference between the second electric voltage drop and the first electric voltage drop. If the switching element 26 does not operate properly, in particular the error signal FS can be output. In detail, the protective electronic circuit 20 comprises a further voltage measuring device (not illustrated here), which is configured to measure the electric input voltage Uin between the inputs 21, 22. The first voltage drop and the second voltage drop are measured by means of measuring the input voltage Uin, measuring the output voltage Uout and forming a difference between the input voltage Uin and the output voltage Uout. In the exemplary embodiment shown, the first voltage drop upon proper operation of the switching element should be 0 V. If the switching element 26 is turned off to the second conductive condition "off" thereof, the second voltage drop should be appreciable, in particular on account of the current limiting resistor element 34. In other words, the output voltage Uout should be less than the input voltage Uin, and in the exemplary embodiment shown should be 35.8 V instead of 36 V, for example. If the difference between the second electric voltage drop and the first electric voltage drop reaches and/or exceeds a predetermined difference voltage drop limit value, for example 0.2 V=200 mV, it may be assumed that the switching element 26 is operating properly. If the difference between the second electric voltage drop and the first electric voltage drop is below the predetermined difference voltage drop limit value, the error signal FS is output.

In the exemplary embodiment shown, the switching element 26 in the form of the field effect transistor is disposed as the sole switching element in the power path 25 between one of the inputs 21 and one of the outputs 23. In alternative exemplary embodiments, a plurality of switching elements, in particular a plurality of electronic switching elements, in particular field effect transistors, can be disposed in series in the power path between one of the inputs and one of the outputs. This can make it possible not only to turn off in the case of overcurrent, but also to prevent a charging current. In addition, the method can comprise determining a proper operation of each of the switching elements, as described above.

Moreover, the method comprises the steps: providing an electric minimum power by the accumulator 80 on the outputs 23, 24, even if the switching element 26 is turned off to the second conductive condition "off"; performing a self-check of the gardening and/or forestry apparatus 90 using the provided electric minimum power. This can make it possible to determine a proper operation of the motor electronic circuit 92. In the exemplary embodiment shown, by way of example, an output voltage of 35.8 V and an electric current of 2 mA can be provided.

Furthermore, in the exemplary embodiment shown, the protective electronic circuit 20 comprises a load circuit 39, in particular for the bypass path 33 with the current limiting resistor element 34. The load circuit 39 can ensure the minimum current through the bypass path 33 and/or the power path 25, even if the switching element 26 is turned off to the second conductive condition off. As a result, it is possible to generate a defined voltage drop across the kickback protective element 37 in the form of the diode and the resistor or resistors in the bypass path 33. In particular, the load circuit 39 is connected to the power path 25 between the switching element 26 or the bypass path 33 and at least one of the outputs 23, 24.

Moreover, the electric gardening and/or forestry apparatus system 10 comprises a user carrying device 71, as can be discerned in FIG. 3. The protective electronic circuit 20 is arranged in the user carrying device 71. The user carrying device 71 in the form of a belt pouch is configured to allow carrying of the protective electronic circuit 20 by a user. The protective electronic circuit 20 and the user carrying device 71 are part of a protective electronic circuit system 70 according to an embodiment of the invention or form said system. Furthermore, the user carrying device 71 comprises an accumulator receiving device 72. The accumulator receiving device 72 is configured to receive the accumulator 80. Moreover, the protective electronic circuit 20 and the accumulator 80 are part of an accumulator system 85 according to an embodiment of the invention or form said system, as can be discerned in FIG. 2.

As made clear by the exemplary embodiments shown and explained above, the invention provides an advantageous method for operating an electric gardening and/or forestry apparatus system which has improved properties, in particular more functionalities, and also a protective electronic circuit for an electric gardening and/or forestry apparatus system, a protective electronic circuit system comprising such a protective electronic circuit, an accumulator system comprising such a protective electronic circuit and an electric gardening and/or forestry apparatus system comprising such a protective electronic circuit. In particular, the method and the protective electronic circuit each make it possible to protect the gardening and/or forestry apparatus against an overcurrent and to differentiate an overcurrent on account of a short circuit from an overcurrent which may be caused in particular by a relatively low internal inductance and/or a relatively low internal resistance of the accumulator.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for operating an electric gardening and/or forestry apparatus system, the gardening and/or forestry apparatus system comprising:
    an accumulator;
    a gardening and/or forestry apparatus having an electric motor; and
    a protective electronic circuit, the protective electronic circuit including inputs which are connected to the accumulator, outputs which are connected to the gardening and/or forestry apparatus, and a switching element which is disposed in a power path between one of the inputs and one of the outputs,
    wherein the method comprises the steps of:
    a) turning on the switching element to a first conductive condition (on);
    b) measuring an electric current through the power path;
    c) turning off the switching element to a second conductive condition (off), if the measured electric current exceeds a predetermined current limit value;
    d) measuring an electric output voltage between the outputs in order to differentiate between a short-circuit case and normal operation; and either
        e1) again turning on the switching element to the first conductive condition (on), if the measured electric output voltage reaches and/or exceeds a predetermined voltage limit value, or
        e2) outputting an error signal, if the measured electric output voltage is below the predetermined voltage limit value,
    wherein the method further comprises the steps of:
    measuring a first electric voltage drop on the switching element, when the switching element is turned on to the first conductive condition (on) thereof;
    measuring a second electric voltage drop on the switching element, when the switching element is turned off to the second conductive condition (off) thereof; and
    determining a proper operation of the switching element as a function of a difference between the second electric voltage drop and the first electric voltage drop.

2. The method according to claim 1, wherein
the predetermined current limit value is in a range from 200 A to 500 A, and/or
the accumulator provides an input voltage with an input voltage value between the inputs and the predetermined voltage limit value is a function of the input voltage value.

3. The method according to claim 1, wherein
the step e1) is performed in a range from 0.5 ms to 10 ms subsequent to step c).

4. The method according to claim 1,
wherein the steps b) through e1) are repeated.

5. The method according to claim 1, wherein
the switching element includes a field effect transistor to which a control voltage for turning on to the first conductive condition (on) thereof and for turning off to the second conductive condition (off) thereof is applied on a control electrode, and
the step c) comprises generating the control voltage such that an avalanche effect does not occur.

6. The method according to claim 1, further comprising the steps of:
providing an electric minimum power by the accumulator on the outputs, even if the switching element is turned off to the second conductive condition (off); and
performing a self-check of the gardening and/or forestry apparatus using the provided electric minimum power.

7. A protective electronic circuit for an electric gardening and/or forestry apparatus system, comprising:
inputs which are configured to be connected to an accumulator;
outputs which are configured to be connected to a gardening and/or forestry apparatus having an electric motor;
a switching element which is disposed in a power path between one of the inputs and one of the outputs;
a current measuring device which is configured to measure an electric current through the power path;
a voltage measuring device which is configured to measure an electric output voltage between the outputs in order to differentiate between a short-circuit case and normal operation;
an output device which is configured to output an error signal; and
a control unit which is configured to interact with the switching element, the current measuring device, the voltage measuring device and the output device and to turn on the switching element to a first conductive condition (on), to turn off the switching element to a second conductive condition (off), if the measured electric current exceeds a predetermined current limit value, to again turn on the switching element to the first conductive condition, if the measured electric output voltage reaches and/or exceeds a predetermined voltage limit value, and to activate the output device to output the error signal, if the measured electric output voltage is below the predetermined voltage limit value,
wherein the protective electronic circuit further comprises:
a bypass path which is coupled in the power path in parallel to the switching element and includes a current limiting resistor element.

8. The protective electronic circuit according to claim 7, wherein
the switching element includes an electronic switching element.

9. The protective electronic circuit according to claim 8, wherein
the electronic switching element is a field effect transistor, a bipolar transistor and/or a bipolar transistor with isolated gate electrode.

10. The protective electronic circuit according to claim 8, wherein
the switching element includes a field effect transistor which is configured such that a control voltage for turning on to the first conductive condition (on) thereof and for turning off to the second conductive condition (off) thereof is applied on a control electrode, and
the protective electronic circuit includes a voltage limiting element which is configured to generate the control voltage such that an avalanche effect does not occur.

11. A protective electronic circuit system, comprising:
a protective electronic circuit according to claim 7; and
a user carrying device, wherein the protective electronic circuit is arranged in the user carrying device, and wherein the user carrying device is configured to allow carrying of the protective electronic circuit by a user.

12. An accumulator system, comprising:
an accumulator; and
a protective electronic circuit according to claim 7, wherein the inputs are connected to the accumulator.

13. An electric gardening and/or forestry apparatus system, comprising:
a gardening and/or forestry apparatus having an electric motor; and
a protective electronic circuit according to claim 7, wherein the outputs are connected to the gardening and/or forestry apparatus.

14. The electric gardening and/or forestry apparatus system according to claim 13, wherein
the gardening and/or forestry apparatus is a saw, a pole pruner, a clearing saw, a brush cutter, a hedge pruner, hedge shears, a hedge cutter, a hedge trimmer, a blower device, a leaf blower, a lopper, a cutoff grinder, a sweeper device, a sweeper roller, a sweeper brush, a lawn mower, a dethatcher, grass shears and/or a grass trimmer.

15. A protective electronic circuit for an electric gardening and/or forestry apparatus system, comprising:
inputs which are configured to be connected to an accumulator;
outputs which are configured to be connected to a gardening and/or forestry apparatus having an electric motor;
a switching element which is disposed in a power path between one of the inputs and one of the outputs;
a current measuring device which is configured to measure an electric current through the power path;
a voltage measuring device which is configured to measure an electric output voltage between the outputs in order to differentiate between a short-circuit case and normal operation;
an output device which is configured to output an error signal; and
a control unit which is configured to interact with the switching element, the current measuring device, the voltage measuring device and the output device and to turn on the switching element to a first conductive condition (on), to turn off the switching element to a second conductive condition (off), if the measured electric current exceeds a predetermined current limit value, to again turn on the switching element to the first conductive condition, if the measured electric output voltage reaches and/or exceeds a predetermined voltage limit value, and to activate the output device to output the error signal, if the measured electric output voltage is below the predetermined voltage limit value, wherein the protective electronic circuit is further configured to measure a first electric voltage drop on the switching element, when the switching element is turned on to the first conductive condition (on) thereof; measure a second electric voltage drop on the switching element, when the switching element is turned off to the second conductive condition (off) thereof; and determine a proper operation of the switching element as a function of a difference between the second electric voltage drop and the first electric voltage drop.

16. A method for operating an electric gardening and/or forestry apparatus system, the gardening and/or forestry apparatus system comprising:
- an accumulator;
- a gardening and/or forestry apparatus having an electric motor; and
- a protective electronic circuit, the protective electronic circuit including inputs which are connected to the accumulator, outputs which are connected to the gardening and/or forestry apparatus, a switching element which is disposed in a power path between one of the inputs and one of the outputs, and a bypass path which is coupled in the power path in parallel to the switching element and includes a current limiting resistor element;

wherein the method comprises the steps of:
- a) turning on the switching element to a first conductive condition (on);
- b) measuring an electric current through the power path;
- c) turning off the switching element to a second conductive condition (off), if the measured electric current exceeds a predetermined current limit value;
- d) measuring an electric output voltage between the outputs in order to differentiate between a short-circuit case and normal operation; and either
  - e1) again turning on the switching element to the first conductive condition (on), if the measured electric output voltage reaches and/or exceeds a predetermined voltage limit value, or
  - e2) outputting an error signal, if the measured electric output voltage is below the predetermined voltage limit value.

17. The method according to claim 16, wherein the step e1) is performed in a range from 0.5 ms to 10 ms subsequent to step c).

18. The method according to claim 17, wherein the steps b) through e1) are repeated.

19. The method according to claim 16, further comprising the steps of:
- providing an electric minimum power by the accumulator on the outputs, even if the switching element is turned off to the second conductive condition (off); and
- performing a self-check of the gardening and/or forestry apparatus using the provided electric minimum power.

* * * * *